(12) United States Patent
Hirose

(10) Patent No.: US 6,272,029 B1
(45) Date of Patent: Aug. 7, 2001

(54) DYNAMIC REGULATION SCHEME FOR HIGH SPEED CHARGE PUMPS

(75) Inventor: Ryan T. Hirose, Colorado Springs, CO (US)

(73) Assignee: United Microelectronics Corporation, Hsin-Chu (TW)

( * ) Notice: Subject to any disclaimer, the term of this patent is extended or adjusted under 35 U.S.C. 154(b) by 0 days.

(21) Appl. No.: 09/493,987

(22) Filed: Jan. 28, 2000

Related U.S. Application Data

(60) Provisional application No. 60/118,724, filed on Feb. 5, 1999.

(51) Int. Cl.$^7$ .............................. H02M 3/18; G05F 1/40
(52) U.S. Cl. .......................... 363/59; 323/284; 307/110
(58) Field of Search .............................. 363/59, 60, 61, 363/62; 323/282, 284, 280; 327/537, 536; 307/110

(56) References Cited

U.S. PATENT DOCUMENTS

| | | |
|---|---|---|
| 5,635,776 | 6/1997 | Imi . |
| 5,680,300 | 10/1997 | Szepesi et al. . |
| 5,694,308 * | 12/1997 | Cave ....................................... 363/59 |
| 5,973,895 * | 10/1999 | Ternullo, Jr. et al. .................. 363/59 |

OTHER PUBLICATIONS

Barry Arbetter, et al., "DC–DC Converter with Fast Transient Response and High Efficiency for Low–Voltage Microprocessor Loads"; arbetteb@rtt.colorado.edu, makinmov@colorado.edu publ. on or before Feb. 5, 1999.

Barry Arbetter, et al., Control Method for Low–Voltage DC Power Supply in Battery–Powered Systems with Power Management, IEEE Power Electronics Specialists Conference, St. Louis, Missouri, Jun. 22–27, 1997; arbetteb@rtt.colorado.edu, makinmov@colorado.edu.

* cited by examiner

Primary Examiner—Rajnikant B. Patel
(74) Attorney, Agent, or Firm—Stuart T. Langley; William J. Kubida; Hogan & Hartson LLP

(57) ABSTRACT

The present invention involves a charge pump including an input node coupled to receive an input voltage from a power voltage source and an oscillator unit generates a periodic enable regulator signal and a periodic reset signal. A regulator clock unit is coupled to the oscillator unit generating a precharge (PC) signal and a reset regulator signal in response to the enable regulator signal. A pump clock unit receives a master clock signal and generating a plurality of pump clock signals. A charge pump unit is coupled to the input node and is operatively controlled by the plurality of pump clock signals, and coupled to the an output terminal coupled to produce an output signal ($V_{PUMP}$). A regulator unit is coupled to receive the $V_{PUMP}$ signal, the PC signal, the reference signal and the enable regulator signal, where the regulator unit is responsive to the enable regulator signal to operate in either a precharge mode or a regulation mode.

18 Claims, 5 Drawing Sheets

DYNAMIC REGULATION SCHEME FOR HIGH SPEED CHARGE PUMPS

This application is a provisional of 60/118,724 filed Feb. 5, 1999.

BACKGROUND OF THE INVENTION

1. Field of the Invention

The present invention relates, in general, to integrated circuits and, more particularly, to integrated circuits having charge pump circuits generating a power supply voltage from an external power supply voltage.

2. Relevant Background

Electronic systems usually comprise ICs manufactured with a variety of technologies. This has created a need for multiple power supply voltages to be supplied on a single printed circuit board to support the various types of devices on that board. Standard IC voltages required by typical devices range from 5.0 volts to 3.3 volts, or lower voltage. However, there are a number of devices that require power at voltages in addition to the standard available voltages. These include data communications circuits that often require negative voltages, and interface circuitry such an the RS232 interface that specifies voltages ranging from +/−25V. Moreover, some ICs have different voltage requirements internally although they receive power from an industry standard power supply level. Being able to generate a range of voltage levels, including negative voltages and voltages larger in magnitude that the supplied voltage provides a great deal of flexibility to the circuit designer. Also, higher voltage levels often enable faster switching for better performance.

A practical solution to this disparity is to provide DC/DC converter circuitry that changes an input DC voltage into a higher or lower DC voltage required by another device. A negative charge pump operates to generate a negative voltage by charging a pump capacitor during a first half-cycle of a clock to the level of a source voltage. During a second half-cycle the pump capacitor is disconnected from the source and coupled, with its polarity switched, to a reservoir capacitor, thereby pumping charge to the reservoir capacitor and providing an output that is approximately the negative of the input voltage.

A positive charge pump may also operate to generate a higher voltage than the supply voltage (i.e., a "step-up" converter) by coupling the pump capacitor to the source voltage during the first half-cycle. During the second half-cycle, the pump capacitor's positive terminal is disconnected from the source voltage and the capacitors negative terminal is coupled to the source voltage in its place. The pump capacitor's positive terminal is then coupled to the reservoir capacitor to charge it to approximately twice the source voltage.

Larger high output charge pumps usually run at lower frequencies and therefore are not optimized for size. The size of a large, low frequency charge pump may be a limiting factor in obtaining the smallest IC chips as possible. It is desirable to make on-chip charge pumps as small as possible especially when the charge pumps occupy a significant area of the chip. For a target output current, the smaller the size of the charge pump, the higher proportionately the operating frequency must be. Typically, for high-current-output (e.g., greater than 5–10 milliamp) charge pumps, the operating frequency of the pump is dictated by the peak operating current and the rate of change in operating current (di/dt), as well as the size of driver and support circuitry.

One problem with a higher frequency charge pump is that regulation of the output voltage level becomes harder since it might take multiple cycles to turn on and off the charge pump which would result in an unwanted hysteresis. A charge pump whose output capacity per pump cycle is large relative to the load it is driving could change the voltage on the load an appreciable amount. In this case, waiting multiple pump cycles after a regulation point is reached to turn on or off the charge pump is not acceptable.

To remedy this problem, high speed and high power regulation methods utilizing direct current (d.c.) differential amplifiers are used. In this solution, a small portion of time at the beginning of a pump cycle is used to sense whether the voltage on the load is at or below a reference level. If the voltage is below, then a pump is initiated. If the voltage is above, then no pump occurs. With the operating frequency approaching 30 Mhz (33ns period), less than about 20% of each clock cycle (i.e., 7 ns) could be devoted to regulation. Although a fast regulation scheme can be accomplished, a large portion of the total allotted charge pump current is used for regulation in this circumstance. When using a high speed d.c. differential regulation scheme, power consumption is a problem.

If a high frequency charge pump is implemented in an IC that uses an active and standby mode, operation can become more complex. Even if power consumption during the active mode can be tolerated, power consumption by the charge pump might still be a problem during standby mode. Typically the standby mode requires much lower power consumption yet the charge pump must be operational at least some of the time. To conserve power, which is the purpose of the stand-by mode, it is desirable to turn off high powered regulation circuitry when not in use. While still in standby mode, the high powered regulation circuitry must be turned on and stabilized before entering a pump cycle requiring more complicated control and timing circuitry. This stabilization time consumes power and quite possibly increase the current consumption specification during standby.

Another method to decrease the current consumption during standby, is to totally shut-off the high powered regulator and instead use a very low power regulator that is always on. This method requires critical circuitry to ensure that multiple or partial pumps do not occur since the low power regulator takes some time for decisions to be made. In another variant, a low power, low output current pump is operational during standby mode so that a slow turn on or off would only produce a small hysteresis on the output voltage. These prior solutions all require more circuitry and complicated control logic.

SUMMARY OF THE INVENTION

The present invention involves a dynamic regulation system that is both low power and high speed. The regulator in accordance with the present invention compares a reference voltage against an input-signal and has small devices that are clocked such that internal regulator quickly nodes transition to the power rail voltages. Once the internal nodes are at the power rail voltages, little power is consumed. In accordance with the present invention, loading from subsequent circuitry is kept to a minimum so that small devices can be used to implement the internal regulator circuitry. Smaller devices enable the regulator in accordance with the present invention to be faster and consume less power. Thought the present embodiment relates to positive charge pumps, all techniques discussed can be applied to negative charge pumps.

Briefly stated the present invention involves a charge pump including an input node coupled to receive an input voltage from a power voltage source and an oscillator unit generates a periodic enable regulator signal and a periodic reset signal. A regulator clock unit is coupled to the oscillator unit generating a precharge (PC) signal and a reset regulator signal in response to the enable regulator signal. A pump clock unit receives a master clock signal and generating a plurality of pump clock signals. A charge pump unit is coupled to the input node and is operatively controlled by the plurality of pump clock signals, and coupled to an output terminal coupled to produce an output signal ($V_{PUMP}$). A regulator unit is coupled to receive the $V_{PUMP}$ signal, the PC signal, a reference signal and the enable regulator signal, where the regulator unit is responsive to the enable regulator signal to operate in either a precharge mode or a regulation mode.

In another aspect, the present invention involves a method of charge pump regulation in which a dynamic regulator is disabled in a precharged or "ready to fire" state. In this standby state, the dynamic regulator is shut down consuming essentially zero power. The internal nodes of the regulator are decoupled from the power supplies such that no power is consumed, but left connected to a reference voltage and an input signal. Before transition from the standby state to an enabled state, internal nodes of the dynamic regulator are already at a differential precharged level to avoid latency penalty required to slew the internal nodes to proper levels. Immediately after transition to the enable state, the dynamic regulator is clocked with no loss of time.

DETAILED DESCRIPTION OF THE PREFERRED EMBODIMENTS

Figure 1:
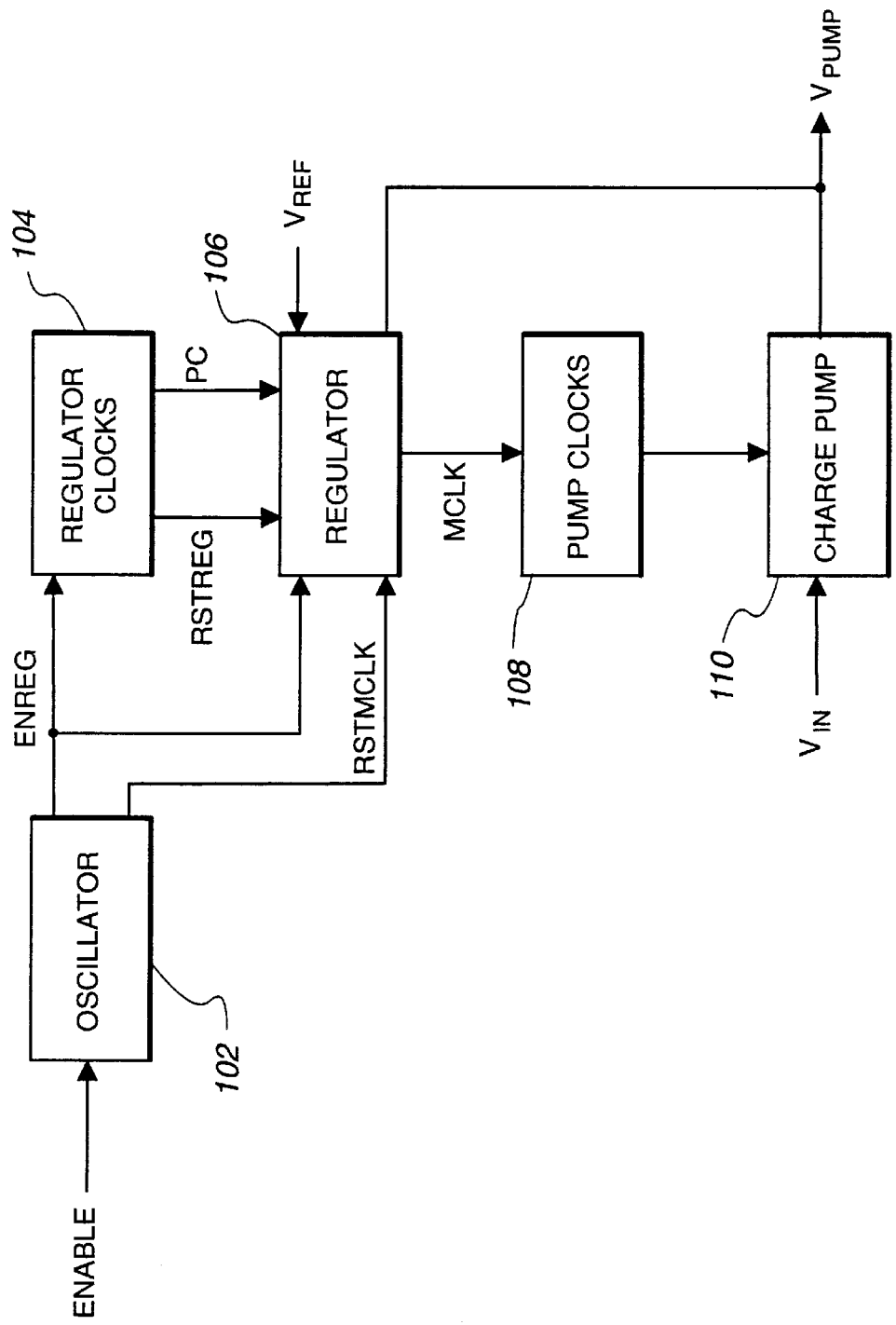
FIG. 1 illustrates a portion of the present invention in block diagram form.

FIG. 1 illustrates in block diagram form a voltage up converter in accordance with the present invention. Electronic systems are usefully represented as an interacting collection of functional units as shown in FIG. 1. Oscillator 102 is enabled by an externally generated ENABLE signal. Oscillator 102 outputs an enable regulator (ENREG) signal that is coupled to regulator clocks unit 104 and regulator unit 106. The ENREG signal is used by regulator clocks unit 104 to derive a precharge (PC) signal and a reset regulator (RSTREG) signal that are coupled to regulator unit 106.

Regulator clocks unit 104 operates such that when the ENREG signal is low (i.e., a disabled state), the PC signal from regulator clocks unit 104 is high to precharge dynamic regulator unit 106 as discussed in greater detail hereinbelow. The ENREG signal is also used in regulator unit 106 to isolate the regulator unit 106 from highly sensitive reference voltage ($V_{REF}$) and signal voltage ($V_{PUMP}$) nodes so that these sensitive nodes are not electrically disturbed during the amplification and latching process. In response to (or in synchronization with) the PC signal transition to a high state to precharge regulator unit 106 for the next cycle, the reset regulator signal (RSTREG) generated by regulator clocks unit 104 is pulsed low to reset the regulator unit 106.

Figure 4:
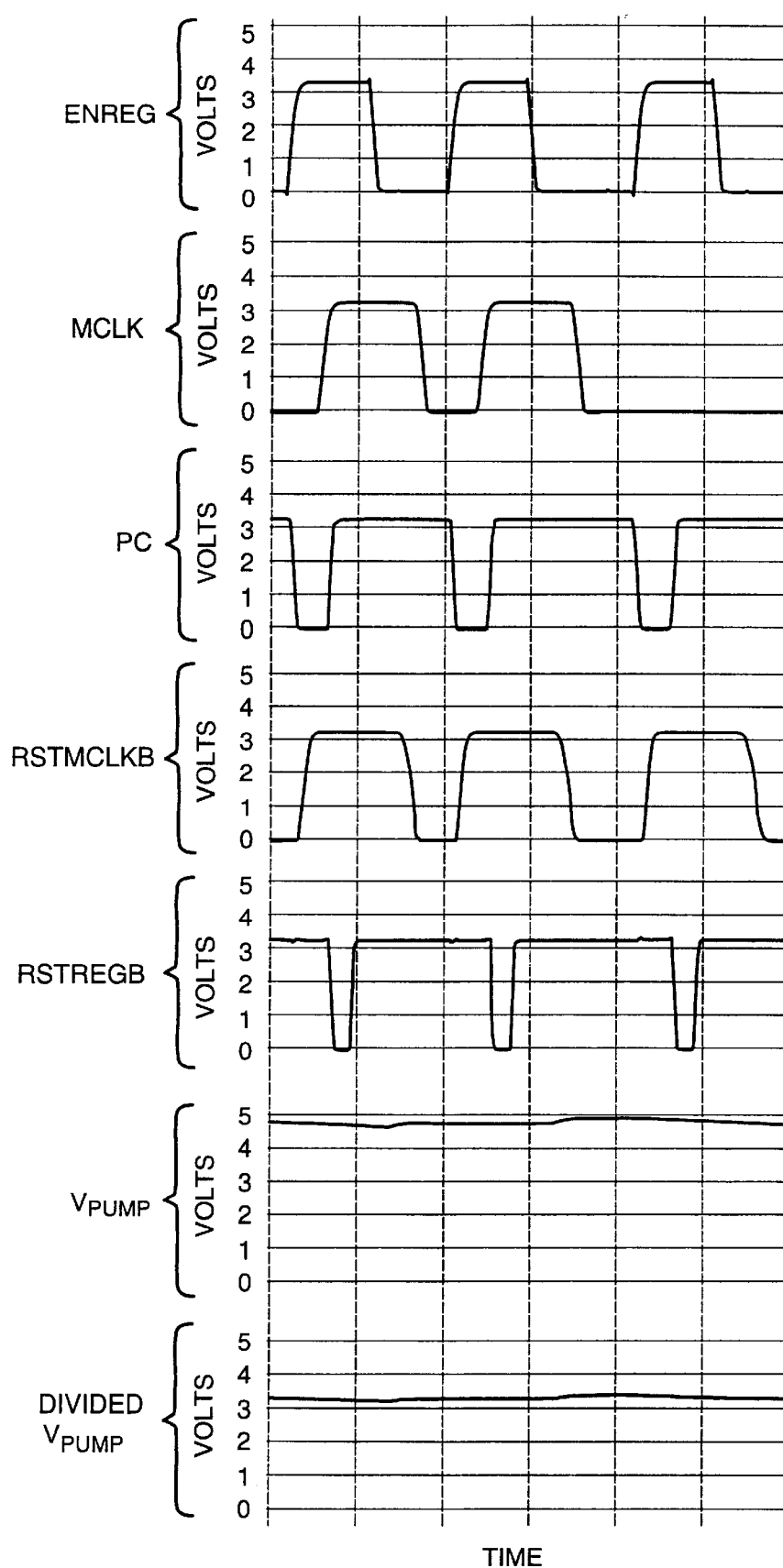
FIG. 4 illustrates exemplary waveforms describing the operation of the circuit shown in FIG. 1 and FIG. 2.

After ENREG transitions to a high state (i.e., an enabled state) and on all subsequent cycles so long as the charge pump is enabled, regulator clocks unit 104 is operative to cause the PC signal to rapidly pulse low (as shown in FIG. 4) to shutoff the precharge and "clock" regulator unit 106. "Clocking" regulator unit 106 means to amplify and latch the difference between the $V_{REF}$ and $V_{PUMP}$ inputs of the dynamic regulator. The latched difference signal is processed (as described in greater detail with reference to FIG. 2) to generate the master clock (MCLK) signal. The MCLK signal is used by pump clocks unit 108 to generate all necessary clocks to drive charge pump unit 110. Detailed understanding of the operation and implementation of pump clocks circuit 108 and charge pump circuit 110 is not necessary to understand the present invention. Accordingly these details are not provided so as to ease illustration and understanding of the present invention.

Figure 2:
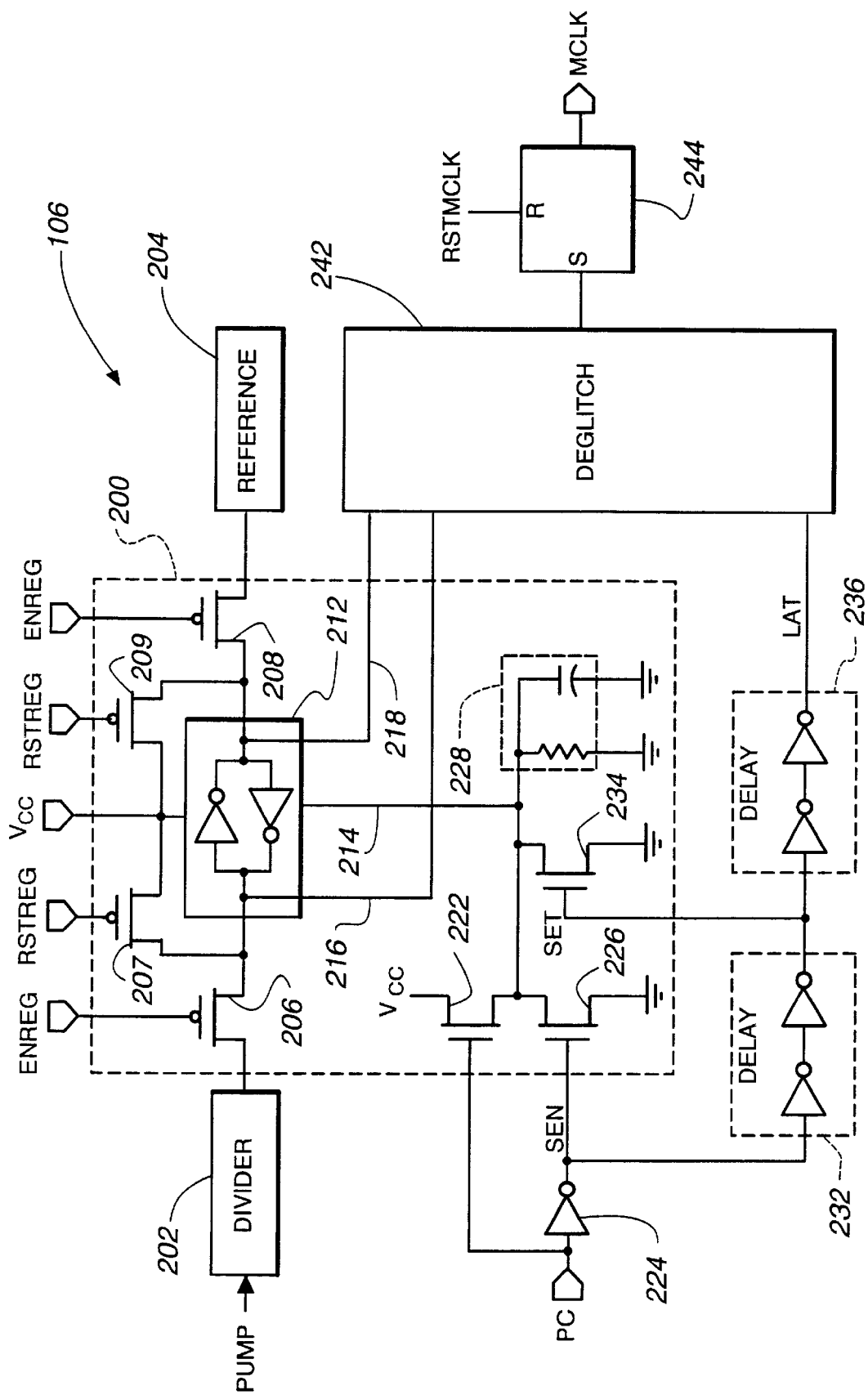
FIG. 2 a regulator unit of the system shown in FIG. 1 in greater detail in mixed block diagram/schematic form.

FIG. 2 shows regulator unit 106 including a dynamic regulator circuit 200 in accordance with the present invention in greater detail in a mixed schematic/block diagram form. One of the inputs to dynamic regulator 200 can be the pumped output $V_{PUMP}$ itself. More typically, a voltage divided version of $V_{PUMP}$ produced by divider unit 202 is used. The $V_{REF}$ input to dynamic regulator 200 comprises a reference voltage generated by reference unit 204 against which $V_{PUMP}$ is compared. In the example of FIG. 2, $V_{PUMP}$ is divided down by divider unit 202 and operated near the positive power supply voltage of regulator unit 106. In this manner, the $V_{REF}$ may be provided by the positive supply voltage itself, avoiding the need for additional reference voltage generator circuitry.

It should be understood that $V_{REF}$ does not have to be at the positive power supply, however, and the particular examples herein are readily adapted to other reference voltage techniques. For example, complementary circuitry is readily available such that $V_{REF}$ and $V_{PUMP}$ operate at or near a negative power supply to regulator unit 106. Other circuitry is available such that the inputs operate at a selected level between the positive and negative supplies. These and similar alternatives are equivalent to the specific examples given herein.

Regulator unit 106 operates to generate an MCLK signal when the divided level of $V_{PUMP}$ is less than $V_{REF}$, signaling that $V_{PUMP}$ is lower than the desired voltage. If $V_{PUMP}$ is at an adequate level (i.e., higher than $V_{REF}$), no MCLK is generated. Dynamic regulator 200 comprises a pair of cross-coupled inverters forming a latch 212 coupled to a load 228 at node 214. Nodes 216 and 218 form inverting and non-inverting outputs of latch 212. Load 228 comprises an resistor-capacitor (RC) circuit that is readily implemented using conventional passive or active devices.

Regulator unit 106 includes a power supply source node that is coupled to the $V_{cc}$ power source, or another available external power source. Node 214 serves as a power supply return node that completes a current flow path from the $V_{cc}$ power source, through regulator unit 106, to ground (or any available return current path to the $V_{cc}$ power source). Load 228 coupled to return node 214 prevents node 214 from floating, but provides sufficient impedance that the voltage on node 214 can be controlled using precharge device 222 and clock devices 226 and 234. Manipulation of the voltage on node 214 enables latch 212 to be operated in a sense mode with node 214 held at a voltage sufficiently near $V_{cc}$ to disable latch 212, and a latch mode in which node 214 is held to ground thereby enabling latch 212.

Dynamic regulator 200 further comprises precharge device 222 and clocking devices 226 and 234. Precharge device 222 is controlled by the PC signal from regulator clocks unit 104 (shown in FIG. 1). Switches 207 and 209 are responsive to the RSTREG signal to precharge output nodes 216 and 218, respectively, to $V_{cc}$. Desirably, output nodes 216 and 218 can be controllably decoupled or isolated from $V_{PUMP}$ and $V_{REF}$ by switches 206 and 208, respectively. Switches 206 and 208 are controlled by the ENREG signal discussed hereinbefore.

The PC signal is coupled through inverter 224 to generate a sense (SEN) signal that controls clocking device 226. The SEN signal is coupled through a first delay unit 232 to generate a SET signal that controls clocking device 234. Delay unit 232 is conveniently implemented as two series coupled inverters to provide a two gate delay time difference between the SEN and SET signals, however, any available delay technology may be used to implement delay 232. The SET signal is coupled through a second delay unit 236 to generate a latch (LAT) signal to deglitch unit 242.

As shown in FIG. 2, inverting output 216 and non-inverting output 218 of latch 212 are coupled to deglitching unit 242. The deglitched signal from deglitching unit 242 is coupled to a set input of output latch 244 that generates a master clock signal (MCLK). Latch 244 can be reset by application of the external RSTMCLKB signal to a reset input of latch 244.

In a particular example, ENREG operates at approximately 30 Mhz with close to 50% duty cycle as shown in FIG. 4. In operation, while the ENREG signal is low (steady state), the PC signal is high and SEN, SET and LAT (shown in FIG. 5) are low. Also a short time after ENREG is low, RSTMCLKB is pulsed low, and a short time after PC is high, RSTREGB has pulsed low and returns to high. The combination of these signals being in the above states places regulator unit 106 in precharge mode. Regulator unit 106 is in the precharge mode during standby and during the low time of the cycling ENREG. With ENREG low, the divided $V_{PUMP}$ signal shown in FIG. 4 is coupled to latch 212 through device 206 and reference input $V_{REF}$ is coupled to latch 212 through device 208. Since the RSTREGB signal pulsed low prior to this, both node 216 and node 218 are precharged to substantially $V_{cc}$. The high PC signal turns precharge device 222 on and clock devices 226 and 234 remain off.

Precharge device 222 is desirably provided by a minimum-length n-channel transistor. In this state, node 214 settles to a voltage substantially equal to a minimum length n-channel threshold drop below $V_{cc}$. This voltage on node 214 turns off the inverters (shown in FIG. 2) within latch 212. In a particular implementation, the inverters in latch 212 are implemented with non-minimum length transistors such that when node 216 and node 218 are near $V_{cc}$, the inverters in latch 212 are off (i.e., not conducting current). Node 216 and node 218 are thus isolated from $V_{cc}$ and node 214 and the only influence that nodes 216 and 218 see is through devices 206 and 208 to the inputs.

Figure 3:
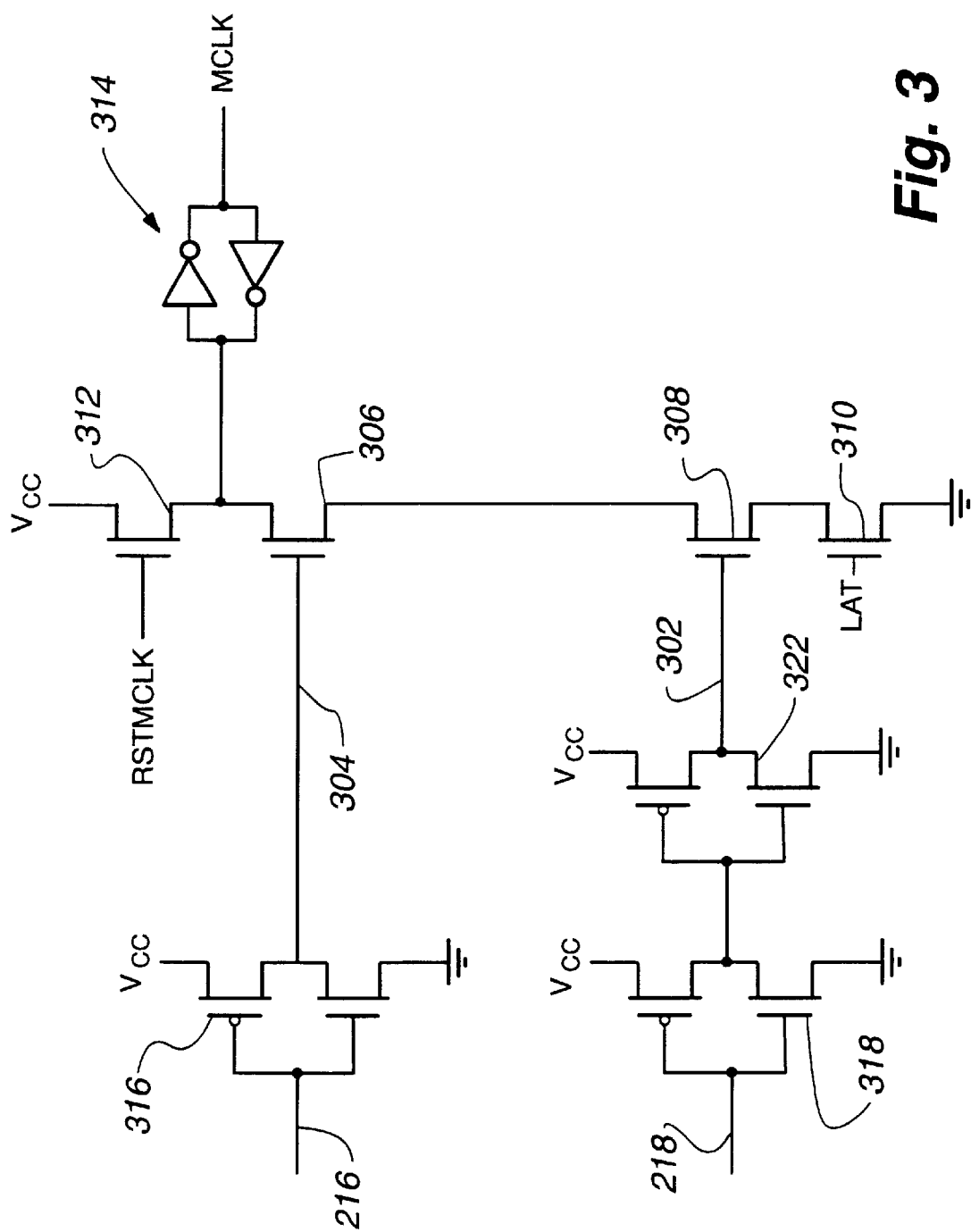
FIG. 3 shows the deglitch and MCLK latch portion of the regulator unit of FIG. 2 in greater detail in schematic form.

FIG. 3 illustrates a preferred implementation of deglitch unit 242 and latch 244 that provide low standby power usage. As shown in FIG. 3, with node 216 and node 218 near $V_{cc}$ (i.e., the precharge state described above) node 302 is high and node 304 is low. Both the low on node 304 and the low LAT signal turns off devices 306 and 310 so that no current path exist even though device 312 is on while RSTMCLKB low. The input to cross coupled inverters 314 is thus high and the generated MCLK signal is low. Hence, while regulator unit 106 is in the precharge mode no current path exist and dynamic regulator 200 is continuously sampling the $V_{PUMP}$ (or the divided $V_{PUMP}$) and the $V_{REF}$ inputs and ready for an immediate regulation when the PC signal goes low.

Figure 5:
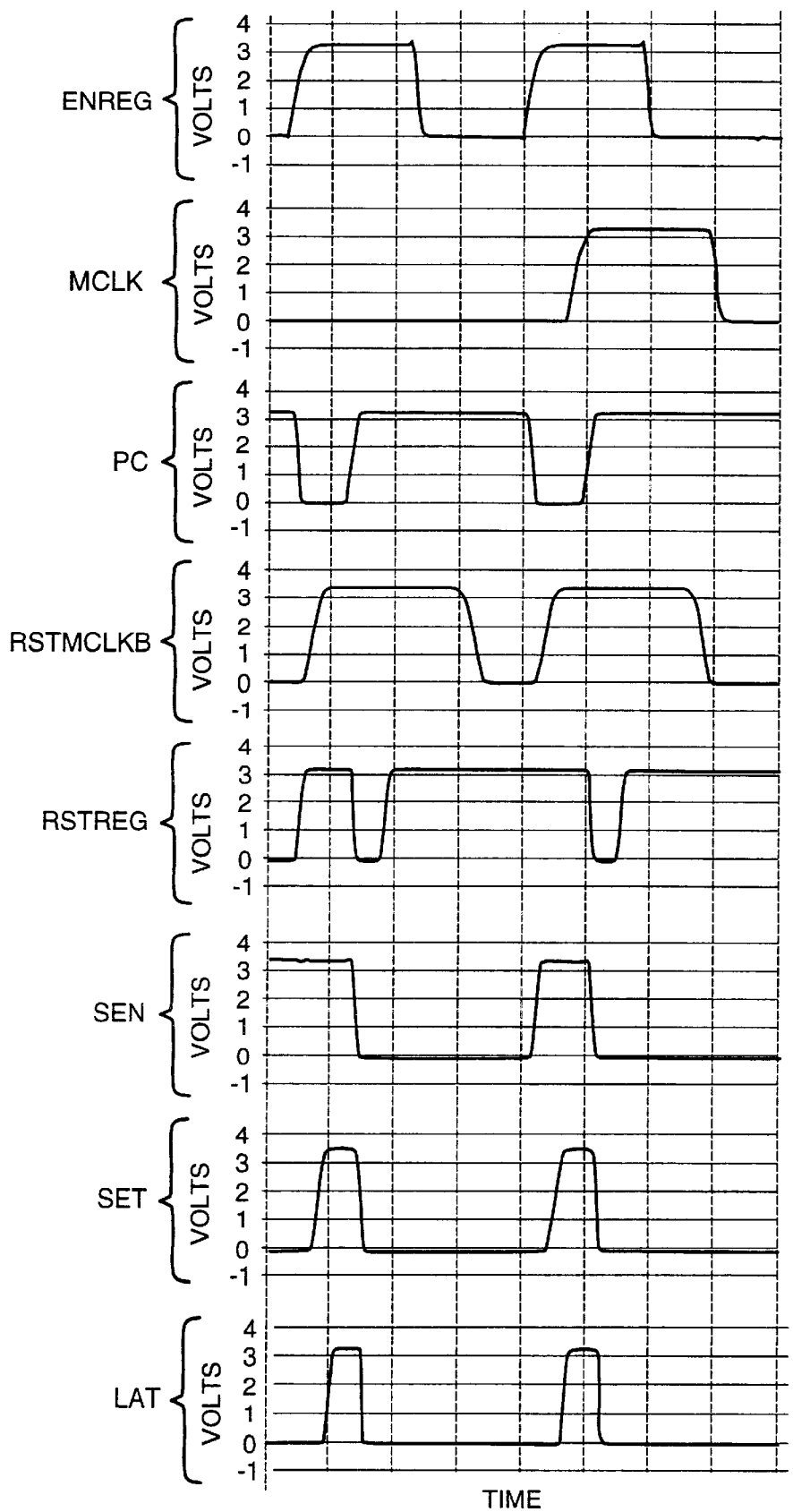
FIG. 5; illustrates other exemplary waveforms describing the operation of the circuit shown in FIG. 1 and FIG. 2.

FIG. 5 shows two cycles, a first cycle without MCLK firing and second cycle with MCLK firing. When the charge pump in accordance with the present invention is enabled, ENREG goes high to turn off devices 206 and 208 shown in FIG. 2. to hold the $V_{PUMP}$(or the divided $V_{PUMP}$) and the $V_{REF}$ input voltages on nodes 216 and 218. PC immediately pulses low to turn off precharge device 222 and SEN goes high to turn on clock device 226. In a particular example, clock device 226 is small relative to clock device 234. Because node 214 is coupled to load 228, node 214 starts to slew from a voltage equal to a minimum length N-channel threshold below $V_{cc}$ slowly to ground.

In a particular embodiment, clocking of the dynamic regulator 106 comprises two stages: a first stage to slowly amplify the difference between the inputs and after a short delay, a second stage to quickly latch the regulator in a state reflecting the state of the inputs. In one embodiment this two stage clocking happens directly within regulator unit 106. During clocking, when a differential existing on node 216 and node 218, node 214 slews low and latch 212 will start to steer the voltage on one of node 216 or node 218 lower. Specifically, if node 216 starts out being lower than node 218, node 218 216 slews low. Similarly, if node 218 starts out lower than node 216, node 218 will initially slew low. Eventually, latch 212 causes the initially higher node to slew towards VCC. With node 216 and node 218 now going in opposite directions, the SET signal goes high a delay time after SEN and turns on relatively larger clock device 234 to cause output nodes 216 and 218 of latch 212 to slew rapidly to their set values. The size difference between clock device 226 and clock device 234 provides the differential slewing rate feature in accordance with the present invention.

Nodes 216 and 218 can be characterized as both starting high with only one node going low and the side that stays high glitches low momentarily. The circuitry shown in FIG. 3 implements deglitch unit 242 used to compensate for the momentary low-going drop on either of nodes 216 and 218. As stated earlier, with both nodes 216 and 218 starting high, node 302 is high and 304 is low. Also, inverter 316 whose input is node 216 is provided with a very low switch point (determined by means of relative transistor sizes) while inverter 318 has a switch point that is below $V_{cc}/2$. If node 216 is the side that goes low, node 304 goes high, and node 218 will experience a low glitch, but not lower than $V_{cc}/2$ and so node 302 stays high. When LAT goes high a delay time after SET, the input to cross-coupled inverters 314 is pulled low. MCLK then sets to enable clock signals generated pump clocks unit 108 (shown in FIG. 1) to fire and drive charge pump 110.

However, if node 216 is the side that stays high but momentarily glitches low but not lower than the switch point of inverter 316, then node 304 stays low. Node 218 goes low and node 302 follows. When LAT goes high, both device 306 and device 308 are off and the input to inverters 314 remains high, preventing generation of the MCLK signal. It should be noted that in the event that 216 and 218 starts out equal to each other, nodes 216 and 218 could both glitch very low past the switch points of inverter 318 first and possibly inverter 316 second. The preference of the deglitch circuit is to not generate MCLK and so under the condition of both nodes 216 and 218 glitching low, inverter 318 would first cause node 302 to go low before inverter 316 possibly causing node 304 to go high. The condition of node 302 low and possibly node 304 high does not generate an MCLK pulse. At some point dynamic regulator 200 must make a decision and either node 216 or node 218 must go back high. If node 216 goes back high, node 304 goes low and no MCLK pulse results when LAT, but if node 218 goes back high, node 302 returns to a high with node 304 already high to generate a full MCLK pulse. With this deglitch scheme no material MCLK pulses are generated.

In the particular example, after ENREG goes high to enable regulation to start, MCLK can fire within approximately 7 ns. Hence, not only is the apparatus and method in accordance with the present invention efficient with low standby power use, it is fast. Moreover, the preferred implementation uses small devices that switch quickly, and once node 216 and 218 have transitioned to the power supply levels, substantially no power is consumed. Hence, the regulator in accordance with the present invention is efficient when active and when switching from standby to active also.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

I claim:

1. A charge pump comprising:
   an input node coupled to receive an input voltage from a power voltage source;
   an oscillator unit generating a periodic enable regulator signal and a periodic reset signal;
   a regulator clock unit coupled to the oscillator unit generating a precharge (PC) signal and a reset regulator signal in response to the enable regulator signal;
   a pump clock unit receiving a master clock signal and generating a plurality of pump clock signals;
   a charge pump unit coupled to the input node and operatively controlled by the plurality of pump clock signals, and coupled to an output terminal coupled to produce an output signal (VPUMP);
   a reference unit generating a reference signal; and
   a regulator unit coupled to use power provided by a power supply and coupled to receive the VPUMP signal, the PC signal, the reference signal and the enable regulator signal, the regulator unit responsive to the enable regulator signal to operate in either a precharge mode in which power use is substantially reduced while the regulator unit is continuously sampling the VPUMP signal, or a regulation mode in which the regulator unit uses power while generating the master clock signal.

2. The charge pump of claim 1 wherein the regulator unit is responsive to the PC signal during the precharge mode to precharge internal regulator nodes.

3. The charge pump of claim 1 wherein the regulator unit is further responsive to the comparative magnitude of the reference signal and the $V_{PUMP}$ signal to generate the master clock signal.

4. The charge pump of claim 1 further comprising a first isolation switch coupled between the $V_{PUMP}$ signal and the regulator unit to selectively isolate the regulator unit from the $V_{PUMP}$ signal in response to the enable regulator signal.

5. The charge pump of claim 3 further comprising a second isolation switch coupled between the reference signal and the regulator unit to selectively isolate the regulator unit from the reference signal in response to the enable regulator signal.

6. The charge pump of claim 1 wherein the PC signal changes state to precharge the internal regulator nodes after the enable regulator signal changes state to initiate the precharge mode.

7. The charge pump of claim 1 wherein the regulator unit is further responsive to the reset regulator signal during the precharge mode to the internal regulator nodes to a voltage source having a magnitude approximately equal to the reference signal.

8. A charge pump comprising:
   an input node coupled to receive an input voltage from a power voltage source;
   an oscillator unit generating a periodic enable regulator signal and a periodic reset signal;
   a regulator clock unit coupled to the oscillator unit generating a precharge (PC) signal and a reset regulator signal in response to the enable regulator signal;
   a pump clock unit receiving a master clock signal and generating a plurality of pump clock signals;
   a charge pump unit coupled to the input node and operatively controlled by the plurality of pump clock signals, and coupled to an output terminal coupled to produce an output signal (VPUMP);
   a reference unit generating a reference signal; and
   a regulator unit coupled to receive the VPUMP signal, the PC signal, the reference signal and the enable regulator signal, the regulator unit responsive to the enable regulator signal to operate in either a precharge mode or a regulation mode, wherein the regulator unit further comprises:
   a power supply source node coupled to an external power source voltage;
   a power supply return node;
   a first switch operatively controlled by the PC signal to couple the power supply return node to voltage substantially equal to the external power source voltage; and
   a second switch operatively controlled by the PC signal to couple the power supply return node to ground.

9. The charge pump of claim 8 further comprising:
   a delay unit coupled to receive the PC signal and generate a delayed PC signal; and
   a third switch operatively controlled by the delayed PC signal coupling the power supply return node to ground.

10. The charge pump of claim 9 wherein the third switch is larger than the second switch.

11. A dynamic regulator generating a clock pulse for use in a charge pump unit, the dynamic regulator comprising:
   a first input node coupled to an output node of the charge pump;
   a second input node coupled to a reference signal;
   a latch having a first supply node coupled to a voltage source, a second supply node, a first signal node coupled to the first input node, and a second signal node coupled to the second input node;
   a load coupling the second supply node to ground, the load having a characteristic time constant; and
   a precharge unit coupled to the second supply node and receiving a precharge control signal, the precharge unit selectively coupling the second supply node to a return node of the voltage source.

12. The dynamic regulator of claim 11 wherein the precharge unit further comprises a first switch responsive to the precharge control signal and coupled to selectively couple the second supply node to a voltage selected to prevent the latch from latching.

13. The dynamic regulator of claim 11 wherein the precharge unit further comprises a first switch operatively controlled by the precharge control signal and having a first current carrying node coupled to the voltage source and a second current carrying node coupled to the second supply node.

14. The dynamic regulator of claim 11 wherein the precharge unit further comprising:
  a first switch operatively controlled by the precharge control signal to couple second supply node to ground;
  a delay unit coupled to receive the precharge signal and generate a delayed precharge signal;
  a second switch operatively controlled by the delayed precharge control signal to couple second supply node to ground.

15. The dynamic regulator of claim 14 wherein the second switch has lower on-resistance than the first switch.

16. The dynamic regulator of claim 11 further comprising a first isolation switch coupled between the first input node and first signal node to selectively isolate the latch from the first input node, the first isolation switch being operatively controlled by an external enable regulator signal.

17. The charge pump of claim 16 further comprising a second isolation switch coupled between the second input node and the second signal node to selectively isolate the latch from the second input node, the second isolation switch being operatively controlled by the external enable regulator signal.

18. A method for generating a clock signal for use in a charge pump device, the method comprising the steps of:
  providing a regulator coupled to sense a reference voltage, a charge pump output voltage, and a periodic enable signal;
  placing the regulator in a precharge state;
  precharging internal nodes of the regulator during the precharge state;
  placing the regulator in a standby state;
  decoupling the internal nodes of the regulator from power supplies during the standby state such that the regulator consumes substantially reduced power;
  coupling the internal nodes of the regulator to the reference voltage and the charge pump output voltage during the standby state;
  placing the regulator in an enabled state in which the internal nodes of the regulator are coupled to be driven by the power supplies; and
  immediately after transition to the enable state, clocking the dynamic regulator to produce the clock signal.

* * * * *